United States Patent [19]

Yasunaga et al.

[11] Patent Number: 4,980,570
[45] Date of Patent: Dec. 25, 1990

[54] DEVICE FOR DETERMINING LOCATION OF APERTURES

[75] Inventors: Soichiro Yasunaga; Kensuke Hasegawa, both of Kawasaki, Japan

[73] Assignee: Riken Denshi Co., Ltd, Higashiarima, Japan

[21] Appl. No.: 483,631

[22] Filed: Feb. 23, 1990

[51] Int. Cl.$^5$ ............................................. G01N 21/84
[52] U.S. Cl. ...................................... 250/561; 356/375
[58] Field of Search ............... 250/561, 562, 563, 572; 356/375, 237, 430, 431

[56] References Cited

U.S. PATENT DOCUMENTS

4,711,579 12/1987 Wilkinson ........................... 250/561

Primary Examiner—Edward P. Westin
Attorney, Agent, or Firm—William J. Daniel

[57] ABSTRACT

The location of an aperture surrounded by a region of different brightness on a plane surface is achieved by line scanning the surface with an optical scanner while shifting the line position stepwise in an orthogonal direction. A change in brightness as the scanner passes between the region and aperture creates in the scanning signals, a pulse indication of the aperture position. Signals for a progressively changing group of successive scanning lines large enough in number to span a given aperture on either side in the orthogonal direction and include a signal for at least one line intersecting the aperture; i.e., three or more consecutive lines, are synchronously compared by time delaying the earlier signals to coincide with the real time signal. The coincidence of one or more line signals indicative of an aperture directly preceded and followed by a line signal free of an aperture indication signifies the presence of an aperture. The aperture indication can be timed to give the X-axis and X-axis coordinates therefor. The aperture indication signal is checked for abnormalities before being accepted.

1 Claim, 4 Drawing Sheets

DEVICE FOR DETERMINING LOCATION OF APERTURES

BACKGROUND OF THE INVENTION

1. Field of the Invention

The present invention is directed to an aperture detecting device for determining the two-dimensional address or location of a small aperture surrounded by regions, i.e., a background, of different optical brightness present on a plane surface such as the pattern film of a printed board.

Perforation of printed circuit boards and the like have hitherto been effected automatically by means of an NC machine. If the perforation is performed after reading an arbitrary pattern, however, there exists no device for automatically determining the two-dimensional location or site of a hole on the board.

2. Description of Prior Art

Figure 1:
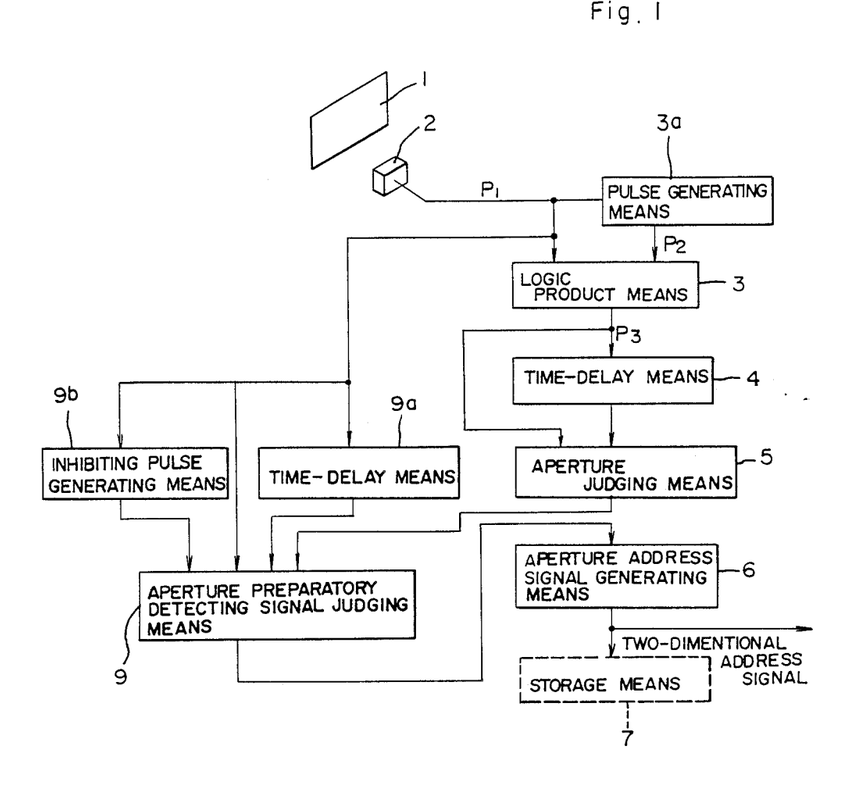
FIG. 1 is a schematic diagram illustrating a general construction of a device for determining the position of an aperture according to the present invention.

Recognizing this need, the applicant of the present invention previously developed the device disclosed in Japanese Patent Application No. 63-201055. This prior arrangement forms the basic context of the present invention and thus appears in FIGS. 1 and 2 of the present drawings to which reference may be had for the following description. The prior device comprises: an optical image sensor for outputting electrical image signals varying according to image brightness in the form of pulses P having a binary value, i.e., one logic state, e.g. 1, for the background region, and another logic state, e.g. zero, for the aperture regions, by effecting linear scanning at a given rate of a plane surface 1 while sequentially shifting in steps of a fixed distance the linear position of sensor 2 in an orthogonal direction relative to the scanning direction; a pulse generating means 3a receiving pulses P, and generating therefrom pulses $P_2$ each having a duration or length set or fixed to correspond to a scanning time or pulse duration slightly greater than a diameter of the apertures to be scanned; a logical product means 3 receiving the set pulses $P_2$ and emitting a signal (logic 1) when the product of the input signals is logic 1, i.e., both are at logic 1 as the image signal pulses $P_3$; time-delay means 4 for delaying signal pulse $P_3$ for a time sufficient to permit a synchronous comparison of the output signal pulses given by the logical product means 3 for at least the newest (last) and oldest (first) scan lines among a group of successive scan lines equal to N+1 where N is the number of scan lines necessary to cover or spanning the orthogonal dimension of the apertures; a small-hole judging means 5 for outputting an aperture detecting signal, indicative of the presence of the aperture, when a logical product pulse $P_3$ is absent from the output signals for the latest non-time delayed scan line $l_0$ and for the oldest time-delayed scan line $l_N$ which are separated by at least one consecutive scan line $l_1-l_{N-1}$ for which a logical product output pulse $P_3$ is present, the judging means being inputted with the non-time delayed output signal from the logical product means 3 for line $l_0$ and N-number of consecutive time-delayed output signals from the logical product means via time-delay means 4 for scan line $l_1-l_N$, i.e., the output signals for a total of (N+1) number of consecutive scan lines, where a logical product output pulse $P_3$ is present in the signal for at least one intervening scan line, e.g., $l_1$, if N=2 or a plurality of consecutive scan lines including the latest line $l_1$ which includes a time-delayed signal, e.g., lines $l_1-l_{N-1}$, if N is more than 2; and an aperture address signal generating means 6 for outputting an aperture address signal with two dimensions or coordinates corresponding to the detection timing in the two dimensions or coordinates of the aperture detecting signal. That is to say, having identified the existence of an aperture by the detection of at least one consecutive line having a pulse $P_3$ preceded and followed by a line having no pulse $P_3$, the location of the aperture can be determined by the time along the line from a known starting point for the scan until $P_3$ occurs and by the number of scan lines of a known separation or "pitch" from a known starting point until a line, or group of lines, having a pulse $P_3$ occurs.

If the aperture address signal is to be used repeatedly, it is necessary that a storage means or memory 7 be connected to the aperture address signal generating means 6.

Figure 2:
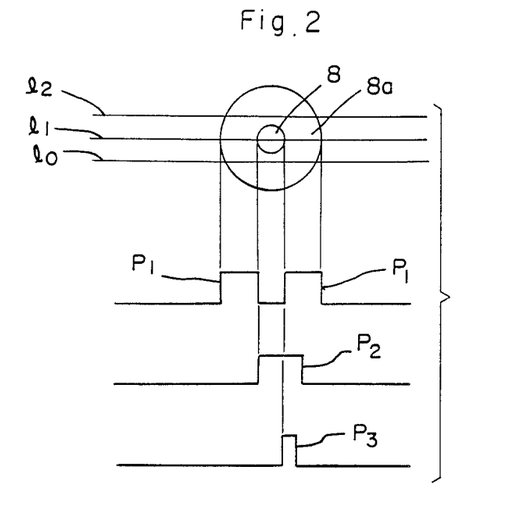
FIGS. 2 and 3 are enlarged detailed diagrams to assist in explaining the operation of the aperture location detecting device of FIG. 1.

With this arrangement, the image sensor 2 effects a linear read-scanning process on the plane surface 1, and sequentially shifts the linear scanning position thereof in steps of a given pitch in the orthogonal direction. Consequently, as illustrated in FIG. 2, a binary-value real-time image signal pulse $P_1$ is first generated when the scanning line crosses or intersects an encircling region 8a around the aperture 8. The image pulse $P_1$ is inputted to the logical product means 3 together the set pulse $P_2$ generated at the moment the scan line crosses the boundary between the region 8a and aperture, i.e., the leading peripheral portion of the aperture 8, due to the change in brightness between these regions during the linear scanning, and immediately the logical product means 3 outputs a logical product pulse $P_3$. Since the set pulse $P_2$ is longer than the maximum dimension of the aperture parallel to the scanning direction, the time-delay means 4 are intended to delay the output signals derived by the logical product means 3 for N number of inputted scan lines for a time sufficient to attain a synchronous comparison thereof relative to each other and the real time, i.e., non-delayed, optical signal from the latest (last) scan line.

Following this, the aperture judging means 5 outputs an aperture detecting signal after it judges the presence of an aperture when there is no logical product pulse $P_3$ present in the real time output signals for scan line $l_0$ which is the latest (last) in time among the (N+1) number of scan lines (all the scan lines to be judged at one time) and for the oldest (first) scan line $l_N$ among the delayed ones, provided a logical product pulse $P_3$ is detected in one delayed output signal (e.g., for line $l_1$ in FIG. 2 or in the delayed signals from each of plurality of consecutive lines $l_1-l_6$ in FIG. 7 where N=7 and six is the maximum number of consecutive lines needed to span the orthogonal dimension, e.g., diameter, of the aperture within range of a timeframe Tr equivalent to a radius).

The aperture address signal generating means 6 serves to output an aperture address signal in two dimensions each time the aperture detecting signal is applied thereto.

The above-mentioned device is capable of automatically determining the two-dimensional address of an aperture for automatic machining thereof. When the position of a scan line coincides exactly with the periphery of the aperture, i.e., passes tangentially thereto, however, a plurality of aperture detecting signals may in some cases be generated for a single aperture on the occasion of a pulse waveform being disturbed at a first or last transition of the pulse waveform corresponding to the aperture. Thus, there is room for improving the operational reliability of this system.

DESCRIPTION OF THE INVENTION

Objects of the Invention

It is a primary object of the present invention, to obviate the foregoing problems inherent in the prior art and to provide an aperture location detecting device capable of improved operational reliability for automatically determining the two-dimensional address on a plane surface of an aperture encircled by a region having a different magnitude of optical brightness from the aperture.

SUMMARY OF THE INVENTION

To this end, according to one aspect of the invention, there is provided a device for detecting a position of an aperture comprising: an image sensor for carrying out a linear read-scan on a plane surface in which at least one aperture, each encircled by a region of different brightness is located and outputting binary image signals while sequentially shifting the scan line position in steps of a given pitch in an orthogonal direction, the output signal changing in logic state when passing from the encircling region to an aperture and vice versa; pulse generating means for generating from such a change in the output signal logic state a binary pulse having a fixed or set time width or duration greater than the scanning time equal to a diameter of the aperture or other maximum dimension of the aperture parallel to the scanning direction; a logical product means for receiving inputs of the set width pulse and the image signal and outputting a pulse equal to the logical product thereof; time-delay means for time-delaying the output signals of the logical product means long enough for a synchronous comparison of the output signals for a progressively changing group of consecutive scan lines large enough in number, in relation to the fixed pitch therebetween, to span across and beyond on both sides the orthogonal dimension of the aperture and include at least one line intersecting the aperture plus lines immediately before and after such intersecting line or lines; an aperture judging means for receiving the non-delayed real time output signal of the logical product for the line being scanned at the time and also output signals from the logical product means via the time delay means for at most N number of scan lines previous thereto ($l_1$-$l_N$) and for outputting a preparatory aperture detecting signal by judging from a comparison of these signals that there exists a probability of an aperture being present when a logical product pulse $P_3$ is not detected in the non-delayed output signal for the line being actually scanned in real time, i.e., $l_0$, or in the time-delayed signal for the oldest (first) scan line $l_N$ of the group N but a logical product pulse $P_3$ is detected in the delayed signals of one or more consecutive scan lines $l_1$-$l_{1-1}$ of the group; and an aperture address signal generating means for outputting a two-dimensional aperture address signal when a detecting signal is outputted by the preparatory, aperture detecting means; and further comprising; a separate or dedicated image signal pulse time-delay means for separately receiving and time-delaying the image signal of the oldest (first) scan line $l_N$ of the group long enough to make a comparison with the non-delayed real time image signal of the latest or current scan line $l_0$; and an inhibiting pulse generating means for receiving the real time signal for the current scan line $l_0$ and generating under certain conditions an aperture detection inhibiting pulse having a time width equal to a line scanning time slightly wider than a diameter, i.e., maximum dimension of the aperture in the scanning direction, wherein between the aperture judging means and the aperture address signal generating means there is interposed a preparatory aperture detecting signal means receiving the output of the aperture judging means as a preparatory detecting signal and supplying a normal detecting signal to the aperture address signal generating means only when both a real time image signal pulse and a delayed image signal pulse outputted from the dedicated time-delay means are present at the same time that a preparatory aperture detecting signal is given and in the absence of a detecting inhibiting pulse.

Figure 3:
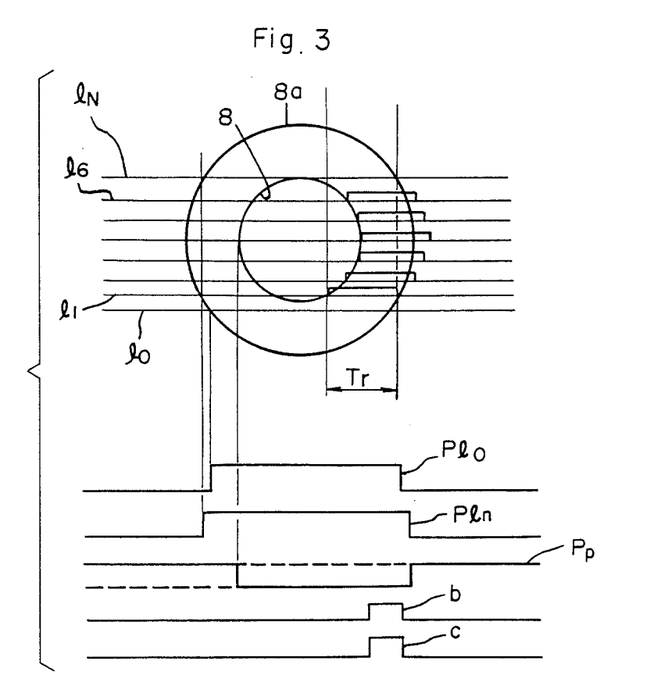

Based on this construction, as illustrated for the aperture depicted in FIG. 3, a preparatory aperture detecting signal judging means 9 (see FIG. 1) (a) receives directly an image signal pulse P $l_0$ during the scan of the latest or current scan line $l_0$ passing through aperture 8, and (b) also receives from the dedicated time-delay means 9a a delayed image signal pulse $Pl_N$ from the scan of the oldest (first) scan line $l_N$ of the group of scan lines being processed. If an aperture detection inhibiting pulse $P_p$ is not applied (a state indicated by a dotted line in FIG. 3, by the inhibiting pulse generating means 9b due to the fact that the aperture itself is not scanned by the current scan line $l_0$, a preparatory aperture detecting signal b (a pulse $P_3$) within a region of a timeframe Tr is judged to be a normal signal. Consequently, a normal aperture detecting signal c is supplied by the judging means 9 to aperture address signal generating means 6 by preparatory judging means 9. If a small preparatory aperture detecting signal b is developed for an aperture which happens for some reason to be not surrounded by the region 8a of different brightness, it is judged that an abnormal state is present, because no image signal pulses $Pl_0$ and $Pl_n$ for either one or both of the scan line $l_0$ or $l_N$ is present at means 9. As a result, the normal aperture detecting signal c is not outputted by means 9. If a preparatory aperture detecting signal b is generated from judging means 5 when an aperture, or a space between the regions 8a, is scanned by the current real time scan line $l_0$, the inhibiting pulse generating means 9b generates an inhibiting pulse $P_p$, i.e., changes to logic 0 shown in solid lines, and no normal detecting signal c is given by means 9.

BRIEF DESCRIPTION OF THE DRAWINGS

Other objects and advantages of the present invention will become apparent during the following description taken in conjunction with the accompanying drawings, in which.

DESCRIPTION OF A PREFERRED EMBODIMENT

Figure 4:
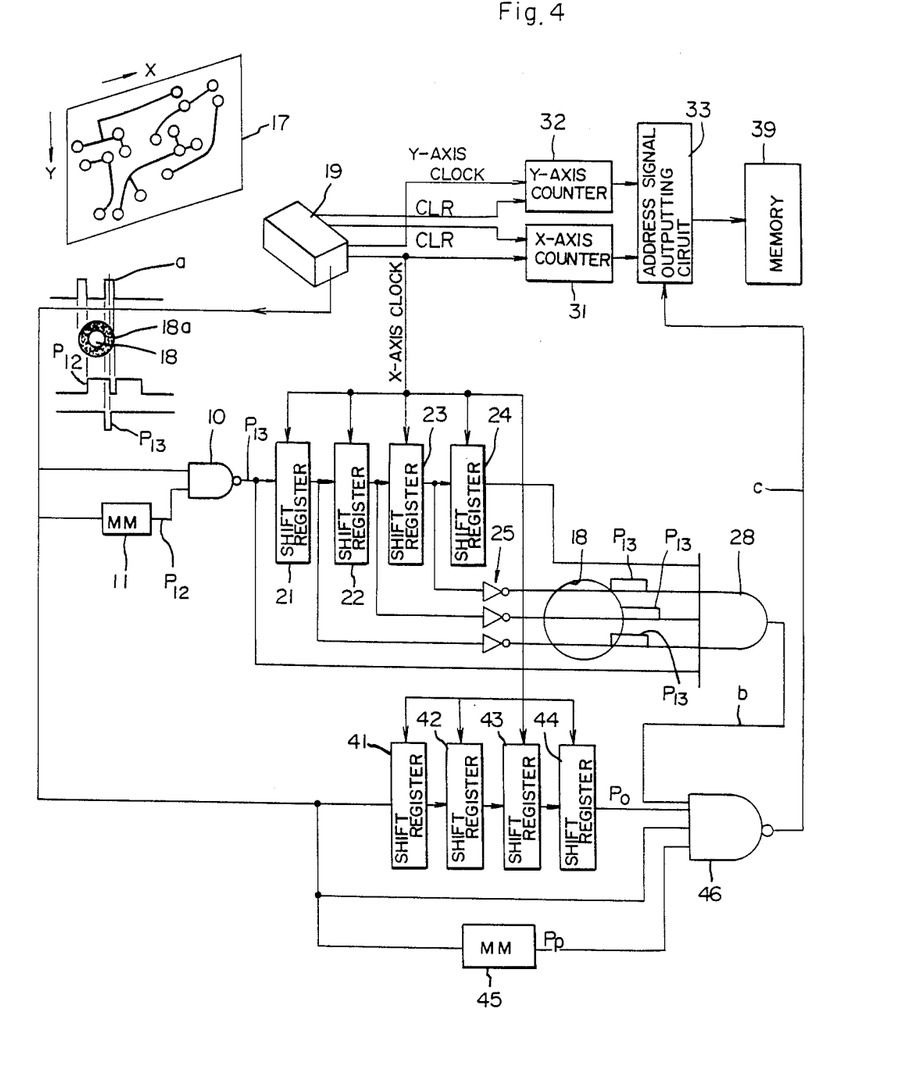
FIG. 4 is a schematic diagram depicting one circuit embodying the present invention.

Referring to FIG. 4, there is illustrated a device for detecting a position of an aperture according to one embodiment of the present invention. In FIG. 4, a TV camera 19 image scans a printed board film 17 in which cooper-foiled parts are shown in black and other parts are transparent, and image signals from camera 15 are applied directly to a NAND gate 10, serving as a logical product means and in parallel to a monostable multivibrator 11 serving as a fixed pulse generating means. More specifically when camera 19 linearly scans the black annular surrounding region 18a around aperture 18, a binary-value image signal pulse a (logic 1) is generated, beginning and ending at the boundaries of that region on each side of the aperture. The output pulse $Pl_2$ (logic 1) from monovibrator 11 has a fixed length or duration slightly greater than the aperture diameter and begins (becomes logic 1) at the leading boundary between the black region 18a (and aperture 18) i.e., at the trailing edge of the first pulse a, and ends (becomes logic 0) slightly past the trailing boundary therebetween and output pulse $P_{12}$ is repeated at the trailing edge of the second pulse a. Inputted to the NAND gate 10 are the pulse a and fixed signal $P_{12}$, functioning as a gate signal, corresponding to a scanning time width slightly wider than a diameter of aperture 18, the gate signal being generated, as mentioned, by the multi-vibrator at a last transition of the first image signal pulse a. NAND gate 10 gives a logic 1 signal output except when a pulse a and a pulse $P_{12}$ are applied simultaneously to its input, in which case it changes to logic 0, generating the logic 0 pulse $P_{13}$ during the interval that pulses a and $P_{12}$ coincide.

Designated at 21 to 24 are shift registers which are constructed at four stages because the scan lines traversing the aperture 18 are three in number (i.e. N=3). Registers 21-24 are connected in series and each has an independent output in parallel to the others. These registers function as time-delay means for output signals $P_{13}$ from the NAND gate 10. The first stage shift register 21 is supplied with the output signals of the NAND gate which are then transferred sequentially to the shift registers 22 through 24 of the subsequent stages by clocks. Each register receives a signal (where present) during each scanning cycle and transfers such signal to the next register (except the last) during the next scan, while receiving the next signal from the next scan. Each register also outputs its signal separately in parallel.

The numeral 28 represents an AND gate functioning as an aperture judging means. Output signals $P_{13}$ in parallel from the first three shift registers 21-23 after inversion to logic 1 state by means of a separate invertor 25, together with an output signal coming in parallel directly from the NAND gate 10, and the output signal directly from the final shift register 24 are all inputted to the AND gate 28. As a function of the pulse width of each of the output signals corresponding to the various logical product signals $P_{13}$ from the shift registers and the extent to which they overlap in time, there is developed a coincidence time or period during which all the output signals $P_{13}$ stored and transmitted from the shift registers 21 through 23 are at a Hi level (logic 1). Since the signals directly from NAND gate 10 and from the fixed shift register 24, corresponding respectively to the latest or current scan line $l_0$ and the oldest (first) scan line $l_N$ of the group of scan lines N+1, contain no signals $P_{13}$ since their scan lines cross region 18a but do not intersect aperture 18 (as suggested visually in FIG. 4 by the superimposition of aperture 18 thereon), these signals are at a logic 1 state and, consequently, under these conditions, a Hi level (logic 1) preparatory aperture detecting signal b is given by AND gate 28.

The numeral 31 denotes a counter, reset for each linear scan, for counting the number from a common reference or starting point on X-axis of stepping on timing pulses of the TV camera 19; and 32 a second counter, reset after completion of the orthoganal scanning operation, for counting the number of Y-axis stepping pulses. An address signal outputting circuit 33 outputs two dimensional address signals corresponding to the instantaneous count values for the X-axis and Y-axis pulses (which denote the location or address along these axes of an aperture) at the time when the preparatory aperture detecting signal b sent from the AND gate 28 is, as will be mentioned later, inputted as a normal aperture detecting signal c, the outputting circuit being capable of compensating for an expected deviation between the count values and the actual address at the central point or axis of the aperture 18. Counters 3 and 32 and also the address signal outputting circuit 33 together constitute an aperture address signal generating means. Indicated at 39 is a memory for storing aperture positional signals for the two-dimensional distances along the X and Y axes.

The components discussed up to this point essentially correspond to a configuration disclosed in above-identified Japanese Patent Application No. 63-201055. In addition to these components, the present invention adds the following components: a separate time-delay means 9a (FIG. 1) dedicated to the image signal pulses, to which the image signal pulses a are directly inputted, the time-delay means being composed of at least four-staged shift registers 41-44 (FIG. 4) adapted to function under the control of the X-axis clock; an inhibiting pulse generating means 9b (FIG. 1) for generating an aperture detection inhibiting pulse $P_p$, constituted by e.g., a monostable multi-vibrator 45 (FIG. 4) for generating a gate pulse of Lo level (logic O) which is triggered at the last (leading edge) transition of the second image signal pulse a, corresponding to the trailing edge boundary between aperture 18 and region 18a; and a preparatory aperture detecting signal judging means 9 in the form of e.g. a NAND gate 46 (FIG. 4) to which are inputted all of the level (logic 1) preparatory aperture detecting signal b from AND gate 28, the Hi level (logic 1) delay image signal pulse $P_p$ from the monostable multi-vibrator 45. The NAND gate 46 serves to generate and deliver to the address signal outputting circuit 33, a normal aperture detecting signal c at Lo level (logic 0) corresponding to the Hi level preparatory aperture detecting signal b when all of these four input signals to gate 46 are at the Hi level (logic 1).

The description will now turn to the operation of the above system.

When scanning the generally annular black surrounding region 18a during an X-axis linear scan, an image signal pulse a at Hi level which is continuous from one boundary to the other, i.e., uninterrupted by an aperture 18, is generated. In this case, the monostable multivibrator 11 outputs a pulse signal $P_{12}$ just when the brightness varies from black to light, i.e., at the trailing edge of the region. In the meantime, the image signal pulse a of the black surrounding region 18a is inputted to NAND gate 10 which in turn outputs a logical product signal P₁₃. The shift registers 21 through 24 hold four consecutive output signals for four consecutive scans outputted from NAND gate 10. Whenever the contents of the respective registers are sequentially transferred one by one to the next register or to gate 28, by stepping clock of the X-axis linear scan, a coincidence judgment is made in AND gate 28. If no logical product signal $P_{13}$ exists in the output signals of either of the NAND gate 10 and shift register 24, and signals corresponding to the logical product signals $P_{13}$ from all the remaining shift registers 21–23 coincide in time or overlap, preparatory aperture detecting signal b is outputted.

Figure 5A:
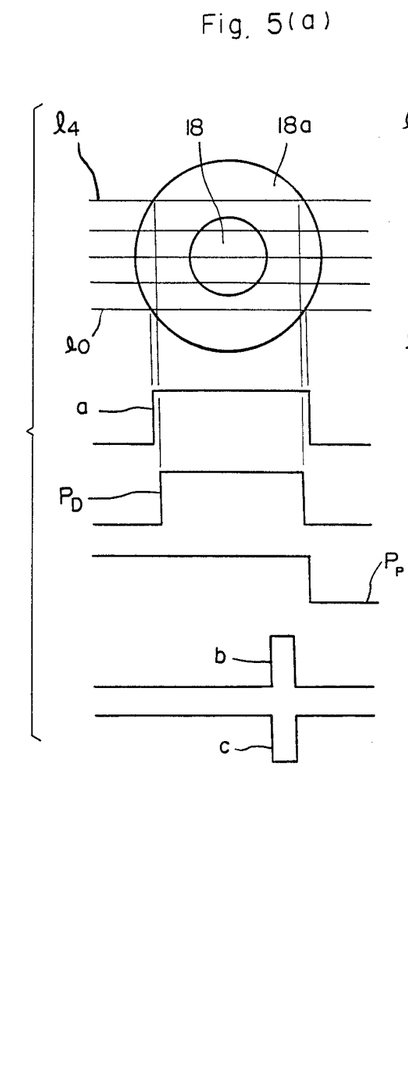
FIGS. 5(a) and 5(b) are diagrams each showing an operational waveform in the embodiment of the invention.

The preparatory detecting signals b are supplied to the NAND gate 46, at which the signal for the latest or real time scan line l₀ contains, as illustrated in FIG. 5(a), a Hi-level image signal pulse a corresponding in duration to the time needed for the scanning line to move across surrounding region 18a. Outputted from the final shift register 44 is the delay image signal pulse $P_D$ corresponding to the image signal pulse a of the first scan line $l_4$ ($=l_N$) of the group of lines in question. The shift registers serve only to store and transmit the pulse a for the earliest or first scan line of the group. The latest scan line l₀ does not intersect the aperture 18, and hence the monostable multi-vibrator 45 does not generate any aperture detecting inhibiting pulse $P_p$ at the time when the preparatory detecting signal b is developed, and thus remains at Hi level. As a result, the normal aperture detecting signal c is outputted in accordance with the coincidence.

The counters 31 and 32 sequentially count the number of timing pulses of the X-axis clock and the number of stepping pulses of the Y-axis clock (which can also be timing pulses if the Y-axis steps occur at regular intervals) while the address signal outputting circuit 33 in response to the receipt of a normal aperture detecting signal outputs aperture address signals as X-axis and Y-axis coordinates after compensating the count values to better coincide with actual geometric center of the aperture. Subsequently, circuit 33 causes the memory 39 to store the results for further use as needed.

Figure 5B:
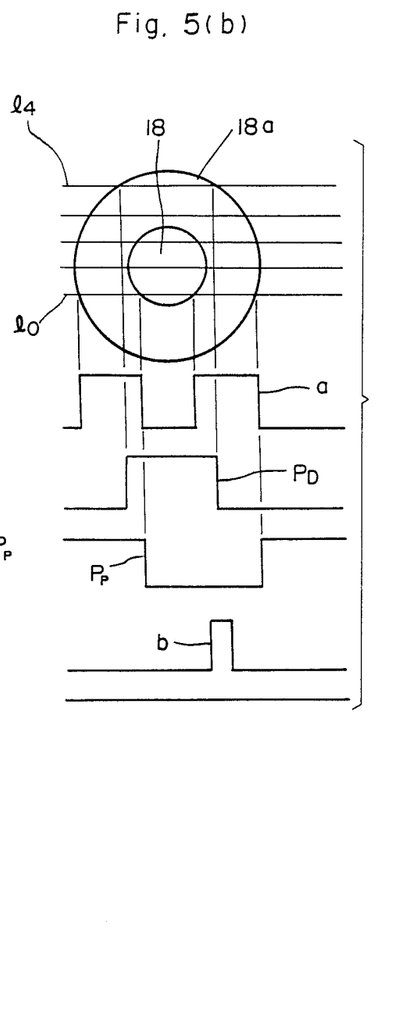

When an aperture 18 itself is, as depicted in FIG. 5(b), scanned (intersected) by the scan line l₀, the monostable multi-vibrator 45 generates an aperture detection inhibiting pulse $P_p$ at L₀ level during the scan coincident with the transition from region 18a to aperture 18 and hence the normal aperture detecting signal c is not developed at the output of NAND gate 46. If there exists no delay image signal pulse $P_D$ or if no real time image signal pulse a is generated, this implies that the region 18a is missing beyond the upper or lower periphery of the aperture which is an abnormal condition. Therefore, the normal aperture detecting signal c is not generated in such cases.

Note that in the embodiment given above, a memory such as a RAM can be employed as a time-delay means instead of the shift registers; and the preparatory aperture detecting signal judging means may be constructed to control switch circuit for inputting the preparatory detecting signal b.

As discussed above, the image sensor read-scans the aperture, and the detection signal is derived from its image signal, thereby automatically establishing the two dimensional address of the aperture. Then a judgment is made as to whether or not the aperture detecting signal is generated normally for the aperture position, with the result that certainty of detection is remarkably improved.

Obviously, the group of scan lines N+1 having their signals being processed continuously changes as the scanning proceeds, the signals for the earliest line $l_N$ being replaced by the next succeeding line $l_{N-1}$, which then become $l_N$, as a new line is scanned as l₀ while the previous l₀ becomes l₁ and so on. The magnitude of number N depends on the size of the apertures and the pitch between successive scan lines.

Although an illustrative embodiment has been described in detail with references to the accompanying drawings, it is to be understood that the present invention is not limited to this precise embodiment. A variety of modifications or changes may be effected therein by one skilled in the art without departing from the scope or spirit of the invention.

What is claimed is:

1. In a device for determining the position of an aperture on a plane surface comprising:
    an optical image sensor for effecting a linear readscan on a plane surface having thereon apertures surrounded by regions of different brightness and outputting image signal pulses having a binary value indicative of brightness changes during scanning, while sequentially shifting the scanning position stepwise in an orthogonal direction;
    a pulse generating means for generating from said image signal a pulse having a fixed time duration slightly greater than the line scanning time for a diameter of said aperture which pulse has a binary-value according to the variation in brightness;
    a logical product means for receiving inputs of the fixed pulse and said image signal pulse; and outputting a pulse equal to the logical product thereof;
    time-delay means for time-delaying the output pulses of said logical product means long enough to make a synchronous comparison in time of the pulses for at least the current and earliest scan lines among a group of consecutive scan lines equal to N+1 where N is the number of lines necessary to span in the orthogonal direction a given aperture including one scan line immediately proximate but exterior to the aperture on either side and at least one intervening line intersecting the aperture;
    an aperture judging means for receiving the real time output signals of said logical product means for each current line in turn together with time-delayed output pulses from said logical product means for at most said N number of consecutive preceding lines and for outputting a preparatory aperture detecting signal by judging the probable presence of an aperture when a logical product pulse is present in said output signal or signals for the one or more intervening lines but not in either the real time or the earliest time-delayed signal; and
    aperture address signal generating means effective upon activation for generating the coordinates along the scanning axis and orthogonal axis of a point on said plane surface at the time of activation,
    the improvement comprising:
    dedicated image signal pulse time-delay means for time-delaying the image signal pulse of said earliest scan line of said group long enough to make a comparison with the real time image signal pulse of the current scan line;
    an inhibiting pulse generating means for generating a detection inhibiting pulse having a duration slightly greater than the scanning time for a diameter of said aperture; and interposed between said aperture judging means and said address signal generating means, a preparatory aperture detecting signal judging means for supplying detecting signal to said aperture address signal generating means to activate the same only when both said image signal pulse and said image signal pulse outputted from said dedicated pulse time-delay means are present in time coincidence with the generation of said preparatory aperture detecting signal and in the absence of any aperture detection inhibiting pulse.

* * * * *

UNITED STATES PATENT AND TRADEMARK OFFICE
CERTIFICATE OF CORRECTION

PATENT NO. : 4,980,570

DATED : December 25, 1990

INVENTOR(S) : Soichiro Yasunaga, Kensuke Hasegawa

It is certified that error appears in the above-identified patent and that said Letters Patent is hereby corrected as shown below:

Column 8, line 57, before "aperture" insert --an--.

Column 9, line 4, after "said" insert --aperture--;
line 6, before "detecting" insert --a normal aperture--.

Column 10, line 4, after "preparatory" cancel "aperture".

Signed and Sealed this

Twenty-eighth Day of April, 1992

Attest:

HARRY F. MANBECK, JR.

Attesting Officer     Commissioner of Patents and Trademarks